United States Patent [19]

Anmo

[11] Patent Number: 5,055,905
[45] Date of Patent: Oct. 8, 1991

[54] SEMICONDUCTOR DEVICE

[75] Inventor: Hiroaki Anmo, Kanagawa, Japan

[73] Assignee: Sony Corporation, Tokyo, Japan

[21] Appl. No.: 599,869

[22] Filed: Oct. 19, 1990

[30] Foreign Application Priority Data

Oct. 19, 1989 [JP] Japan .................................. 1-272341

[51] Int. Cl.$^5$ ............................................ H01L 27/02
[52] U.S. Cl. ..................................... 357/51; 357/23.6;
357/47; 357/55; 357/68
[58] Field of Search .................... 357/23.6, 47, 51, 55,
357/68

[56] References Cited

U.S. PATENT DOCUMENTS

| | | | |
|---|---|---|---|
| 4,686,557 | 8/1987 | Mahrla .................................. | 357/51 |
| 4,805,071 | 2/1989 | Hutter et al. . | |
| 4,887,135 | 12/1989 | Cheney et al. ...................... | 357/23.6 |
| 4,933,739 | 6/1990 | Harari .................................. | 357/51 |

OTHER PUBLICATIONS

Electronics Apr. 16, 1987; 60 No. 8, pp. 69–71.

Primary Examiner—Edward J. Wojciechowicz
Attorney, Agent, or Firm—Hill, Van Santen, Steadman & Simpson

[57] ABSTRACT

A semiconductor device with a capacitive element of an MIS structure comprising an electrode lead segment and an MIS segment in which an electrode is formed through a dielectric layer on an impurity region over to an aperture in a field insulator film. A high-concentration impurity region which connects the impurity region of the MIS segment to the electrode lead region of the electrode lead segment is formed only in the junction between the impurity region and the electrode lead region. The parasitic capacitance between the capacitive element and the semiconductor substrate is reduced without increasing the parasitic resistance so as to consequently achieve high precision in forming the capacitive element.

10 Claims, 7 Drawing Sheets

SEMICONDUCTOR DEVICE

BACKGROUND OF THE INVENTION

1. Field of the Invention

The present invention relates to a semiconductor device which has a capacitive element which comprises an MIS (metal-insulator-semiconductor) structure.

2. Description of Related Art

When a capacitive element is formed in a monolithic integrated circuit (IC), there is generally employed an element of an MIS structure (hereinafter referred to as MIS capacitive element) in which a metal electrode is formed with a dielectric layer on an impurity-diffused region which is formed simultaneously with an impurity region such as an emitter region on a semiconductor substrate.

Normally the MIS capacitive element is formed, as illustrated in FIG. 7, by an N-type epitaxial layer 3 which is grown on a P-type semiconductor substrate 1 and which is surrounded by a P+ element isolating region 2 to form an island. Then an N+ diffused region 4 is formed on the surface of the island region 3. An aperture 5 is then formed in an interlayer insulator film 10 of AsSG or the like on the surface of the substrate in a manner such that the N+ diffused region 4 is exposed in a predetermined area. One electrode 7 of aluminum is formed in the aperture 5 over a dielectric layer 6 which is composed of a silicon nitride (SiN) film or the like, and another electrode 9 of aluminum is formed through an aperture 8 in another exposed portion of the N+ diffused region 4. A capacitance-setting MIS segment 12 comprising the N+ diffused region 4, the dielectric layer 6 and the aluminum electrode 7 are formed; and an electrode lead segment 13 comprising the other portion of the N+ diffused region 4 and the aluminum electrode 9 is also formed. The value of capacitance is determined by the area of the aperture 5 in the MIS segment 12.

In the above-described MIS capacitive element 11, the aperture 5 in the MIS segment 12 is formed by the technique of wet etching. However, there are some disadvantages in this technique because the precision of maintaining the area of the aperture 5 is low due to difficulties in controlling the wet etching, and a high precision of the capacitance cannot be obtained since the parasitic capacitance Cp is not negligible in the portion where the aluminum electrode 7 is superposed on the N+ diffused region 4 with the interlayer insulator film 10 interposed therebetween in the periphery of the aperture 5.

In an attempt to eliminate such disadvantages, the present applicant previously proposed an MIS capacitive element 21 of an improved structure where, as illustrated in FIG. 6, the value of capacitance is determined by the aperture area in a field insulator film 26 formed by selective oxidation (LOCOS). In such MIS capacitive element 21, an island-shaped N-type epitaxial layer 24 is formed over an N+ buried layer 23 on a P-type semiconductor substrate 22 and is surrounded by a P+ element isolating region 25. Then a field insulator film 26 is formed on the substrate surface by selective oxidation. Then an N+ diffused region 28 is formed by ion implantation or the like in the N-type island region 24 adjacent to a first aperture 27, and one electrode 30 of aluminum is deposited on such N+ diffused region 28 over a dielectric layer 29 of silicon nitride (SiN) or the like, whereby an MIS segment 37 is formed. Meanwhile, another electrode 31 of aluminum is deposited on an N+ electrode lead region 33 in a second aperture 32 in the field insulator film 26, whereby an electrode lead segment 38 is formed.

The N+ diffused region 28 and the n+ electrode lead region 33 extend to a depth so that they reach the N+ buried layer 23 through N+ plug-in regions 34 and 35 which are formed by ion implantation through the apertures 27 and 32 respectively, so that the N+ diffused region 28 of the MIS segment 37 is connected to another aluminum electrode 31 through the buried layer 23.

The dielectric layer 29 also extends onto the field insulator film 26, and an interlayer insulator film 36 of AsSG or the like is formed on the dielectric layer 29. The aluminum electrodes 30 and 31 are formed so that they are partially over the interlayer insulator film 36.

In the MIS capacitive element 21 of such a structure, the are of the MIS segment 37 is determined by the aperture 27 in the field insulator film 26, i.e., by the bird's beak which is derived from selective oxidation, so that additional enhanced precision can be expected as compared with the conventional MIS capacitative element 11 shown in FIG. 7.

On the other hand, the N+ buried layer 23 is formed over the entire distance between the N+ plug-in regions 34 and 35 so as to reduce the parasitic resistance in a portion from the N+ diffused region 28 of the MIS segment 37 to the electrode lead segment 38, so that a problem exists with regard to an increase of the parasitic capacitance (or junction capacitance) between the P-type semiconductor substrate 22 and the N+ buried layer 23.

OBJECT AND SUMMARY OF THE INVENTION

It is an object of the present invention to provide an improved semiconductor device which has a high-precision MIS capacitive element in which the parasitic capacitance relative to a semiconductor substrate can be reduced without increasing the parasitic resistance.

So as to achieve this object, the semiconductor device of the present invention is formed so that the capacitive element of a MIS structure comprises an electrode lead segment and a MIS segment where an electrode is formed over a dielectric layer on an impurity region adjacent to an aperture in a field insulator film. A high-concentration impurity region connects the impurity region of the MIS segment to the electrode lead region of the electrode lead segment which is formed merely in a junction between the impurity region and the electrode lead region. Consequently, it becomes possible to reduce the parasitic capacitance between the MIS capacitive element and the semiconductor substrate, so as to further increase the precision of the MIS capacitive element.

In the MIS capacitive element formed in the device of the present invention, the capacitive value is determined by the area of the aperture in the field insulator film, so that high precision is ensured for the capacitive element. Particularly due to the fact that the high-concentration impurity region is formed merely in the junction between the impurity region and the electrode lead region, the parasitic capacitance between the MIS capacitive element and the semiconductor substrate is reduced without increasing the parasitic resistance between the impurity region and the electrode lead region so that the precision of the MIS capacitive element will be further enhanced.

The above and other features of the present invention will become apparent from the following description which will be given with reference to the illustrative accompanying drawings.

DESCRIPTION OF THE PREFERRED EMBODIMENTS

The semiconductor device of the present invention will be described with reference to preferred embodiments illustrated in the accompanying drawings.

Figure 1:
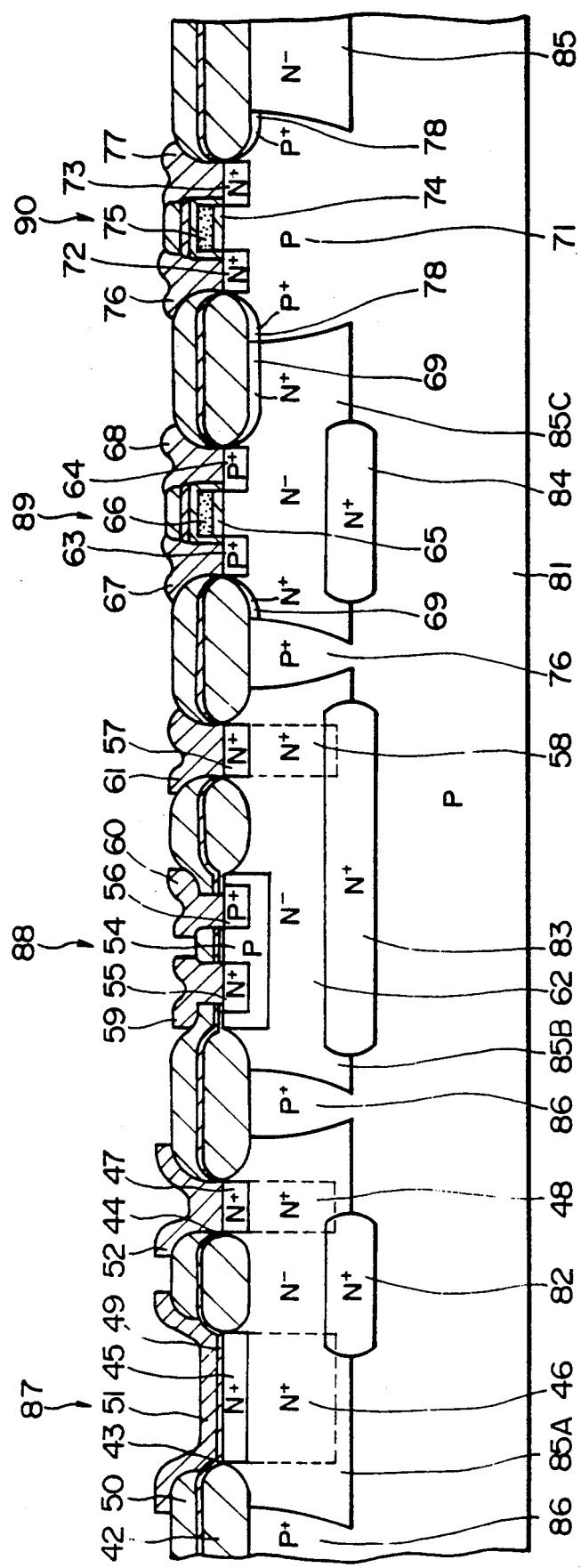
FIG. 1 is a sectional view of a first embodiment of the semiconductor device according to the present invention.
Figure 2:
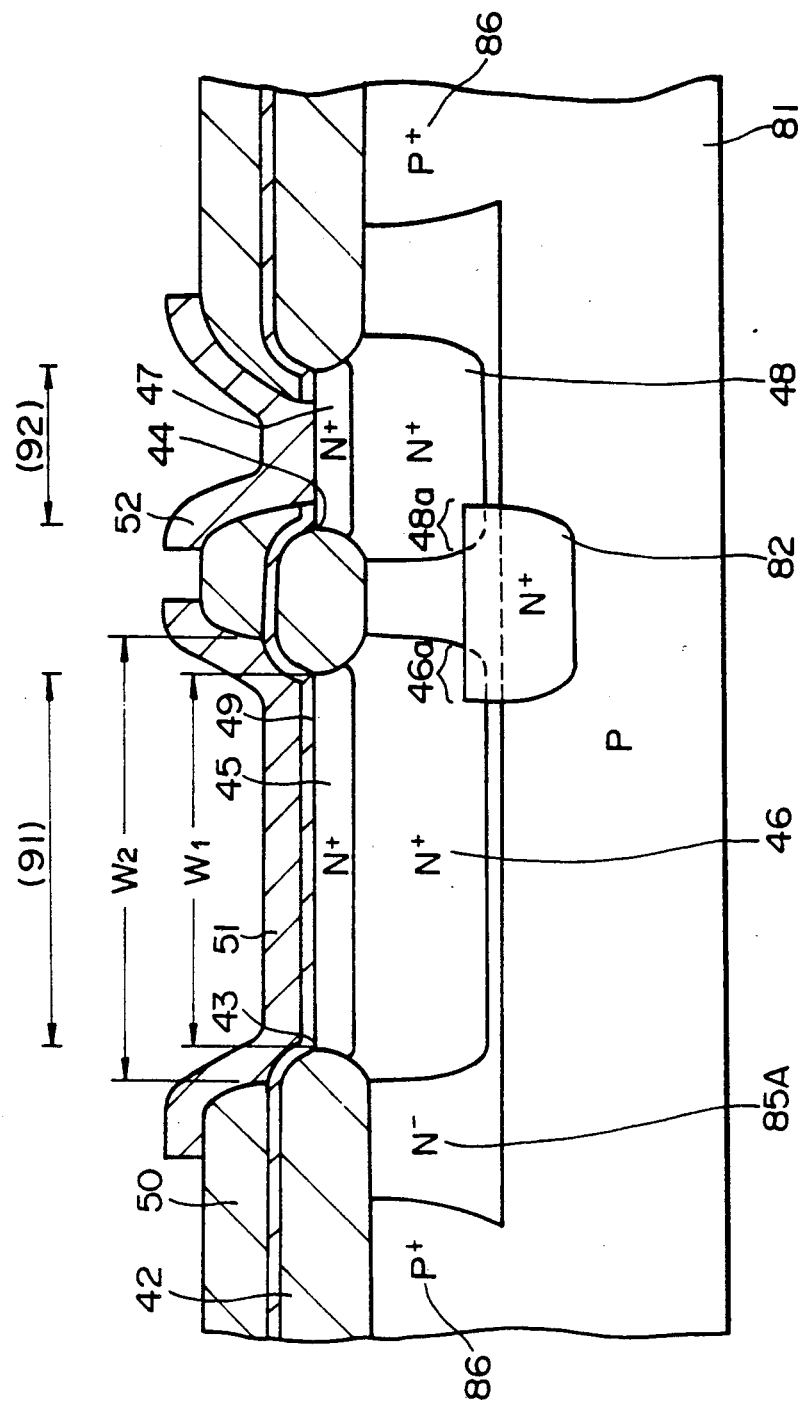
FIG. 2 is an enlarged sectional view of a MIS capacitive element of the embodiment of FIG. 1.

FIG. 1 is a sectional view illustrating an exemplary case of applying the present invention to a semiconductor device where an MIS capacitive element and a bi-CMOS (bipolar transistor element and CMOS transistor element) are formed on a single semiconductor substrate. FIG. 2 is a enlarged view of only the MIS capacitive element.

A P-type semiconductor substrate 81 is illustrated. On the surface of substrate 81, N+ buried layers 82, 83, 84 are respectively, provided in portions where an MIS capacitive element, a bipolar transistor element and a P-channel MOS transistor element are formed. An N-type epitaxial layer 85 is then formed as shown, and further P+ element isolating regions 86 are formed for dividing the N-type epitaxial layer 85 into isolated island regions 85A, 85B, 85C.

In the segment of the semiconductor substrate 91 where such MIS capacitive element 87 is formed, an N+ diffused region 45 is formed by ion implantation or the like in the island region 85A adjacent to a first aperture in a field insulator film 42 which is formed by selective oxidation, i.e., in an aperture 43 for the MIS segment 91, and an N+ plug-in region 46 which is to be connected to the N+ buried layer 82 is formed by ion implantation or the like under the N+ diffused region 45. An N+ electrode lead region 47 is formed by ion implantation or the like in the island region 85A in a second aperture 44 for the electrode lead segment 52, and an N+ plug-in region 48 to be connected to the N+ buried layer 82 is formed by ion implantation or the like under the electrode lead region 47. A dielectric layer 49 which is composed of silicon nitride (SiN) or the like is formed on the field insulator film 42 and in the first aperture 43 with the exception of the electrode lead segment 52, and further an interlayer insulator film 50 composed of AsSG or the like is formed on the dielectric layer 49 over the first insulator film 42. The interlayer insulator film 50 has tapered ends due to reflow.

The width W2 of the aperture in the interlayer insulator film 50 is selectively determined so as to be greater than the width W1 of the first aperture 43 in the field insulator film 42 which is formed thereunder. One electrode 51 of aluminum is formed on the dielectric layer 49 and in the first aperture 43, and another electrode 52 is formed on the N+ electrode lead region 47 over the second aperture 44.

In this embodiment, particularly the N+ buried layer 82 is formed merely in the junction between the plug-in regions 46 and 48, i.e., merely between two plug-in regions 46, 48 and in the joints or edge portions 46a and 48a of the regions 46 and 48. Thus, there is formed an MIS capacitive element 87 whose capacitance value is determined by the area of the first aperture 43 in the field insulator film 42 in the MIS segment 91. (FIG. 2)

In the segment where the bipolar transistor element 88 is formed, a P-type base region 54 is formed in an island region 85B which is composed of an N-type epitaxial layer which is opposed to the N+ buried layer 83, and an N-type emitter region 55 and a P+ base lead region 56 are formed on the surface of the base region 54. In the other portion of the island region 85B, there are formed an N+ collector lead region 57 adjacent to the surface and an N+ plug-in region 58 which is positioned under the collector lead region 57 and which extends so as to reach the N+ buried layer 83. An emitter electrode 59 of aluminum, a base electrode 60 of aluminum and a collector electrode 61 of aluminum which are the ohmic contacts for an emitter region 55, a base lead region 56 and a collector lead region 57, respectively, are formed through the apertures in the field insulator film 42, whereby an NPN bipolar transistor element 88 is formed of an emitter region 55, a base region 54 and a collector region 62.

In the segment where a CMOS transistor is formed of a P-channel MOS transistor element 89 and an N-channel MOS transistor element 90, a P-type source region 63 and a P-type drain region 64 are formed in an island region 85C which is formed of an N-type epitaxial layer opposed to the N+ buried layer 84, and a gate electrode 66 of polycrystal silicon or the like is formed with a gate insulator film 65 on the surface between the two regions 63 and 64. Then a source electrode 67 of aluminum and a drain electrode 68 of aluminum which are in ohmic contact with the source region 63 and the drain region 64 are formed so as to form a P-channel MOS transistor element 89. An N+ channel stop region 69 is formed immediately below the field insulator film 42 of the P-channel MOS transistor element 89. Furthermore, an N-type source region 72 and an N-type drain region 73 are formed in a P-type well region 71 so as to isolate them from the island region 85C of the P-channel MOS transistor element 89, and a gate electrode 75 of polycrystal silicon or the like is formed through a gate insulator film 74 in the surface portion between the two regions 72 and 73. A source electrode 76 of aluminum and a drain electrode 77 of aluminum which are in ohmic contact with the source region 72 and the drain region 73, respectively, are formed so as to constitute an N-channel MOS transistor element 90. In addition, a P+ channel stop region 78 is formed immediately below the field insulator film 42 of the N-channel MOS transistor element 90.

The N+ plug-in regions 46 and 48 in the MIS capacitive element 87 are formed simultaneously with the N+ plug-in region 58 of the bipolar transistor element 88, and the N+ diffused region 45 and the n+ electrode lead region 47 are formed simultaneously with the N+ emitter region 55 and the N+ collector lead region 57 of the bipolar transistor element 88, and also with the N+ source region 72 and the N+ drain region 73 of the N-channel MOS transistor element 90.

In the semiconductor device of the above-described structure and particularly in the MIS capacitive element 87, the aluminum electrode 51 is formed through the dielectric layer 49 on the N+ diffused region 45 adjacent to the aperture 43 by utilizing the aperture 43 in the field insulator film 42 which is formed by selective oxidation in a manner such that high precision can be ensured for the aperture area, hence achieving precise values of capacitance.

In addition, the interlayer insulator film 50 which is composed of AsSG or the like and which is formed by reflow is provided over the dielectric layer 49 on the field insulator film 42, and the aluminum electrode 51 is formed over the interlayer insulator film 50, so that it becomes possible to minimize the parasitic capacitance to a negligible value between the N+ diffused region 45 and the aluminum electrode 51 on both sides of the field insulator film 42 and the interlayer insulator film 50 in the periphery of the aperture 43.

Figure 5A:
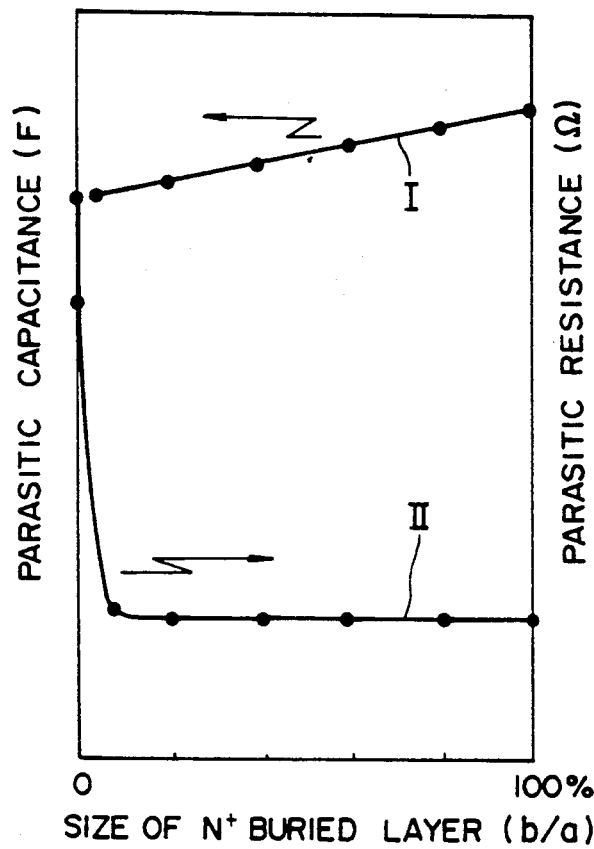
FIG. 5A graphically shows variations which are caused in parasitic capacitance and parasitic resistance by dimensional changes in an N+ buried layer.
Figure 5B:
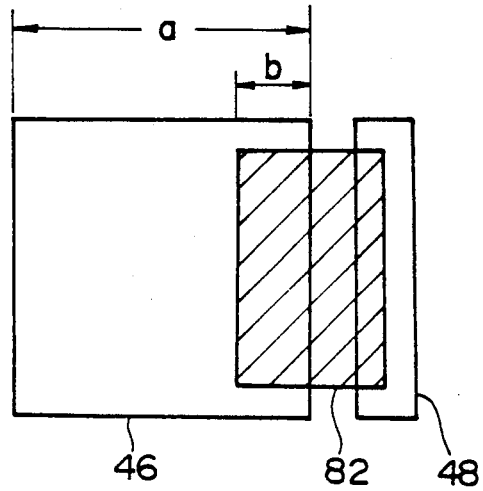
FIG. 5B schematically illustrates a sample used for measuring the values shown in FIG. 5.
Figure 6:
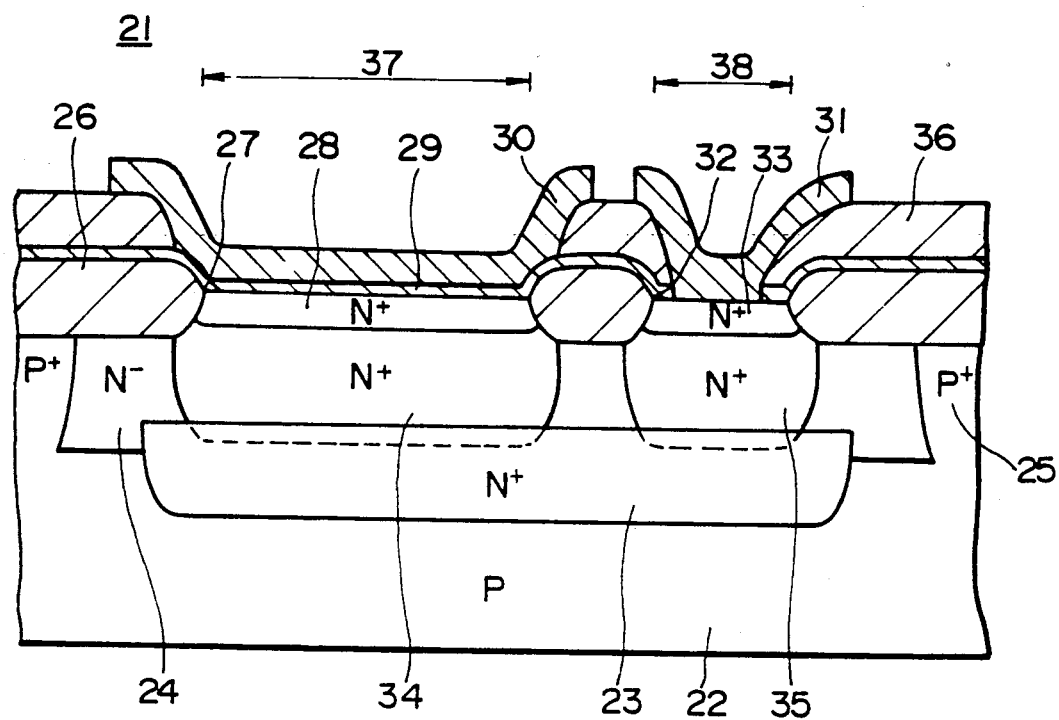
FIG. 6 is a sectional view of an MIS capacitive element which is used as a comparative example.
Figure 7:
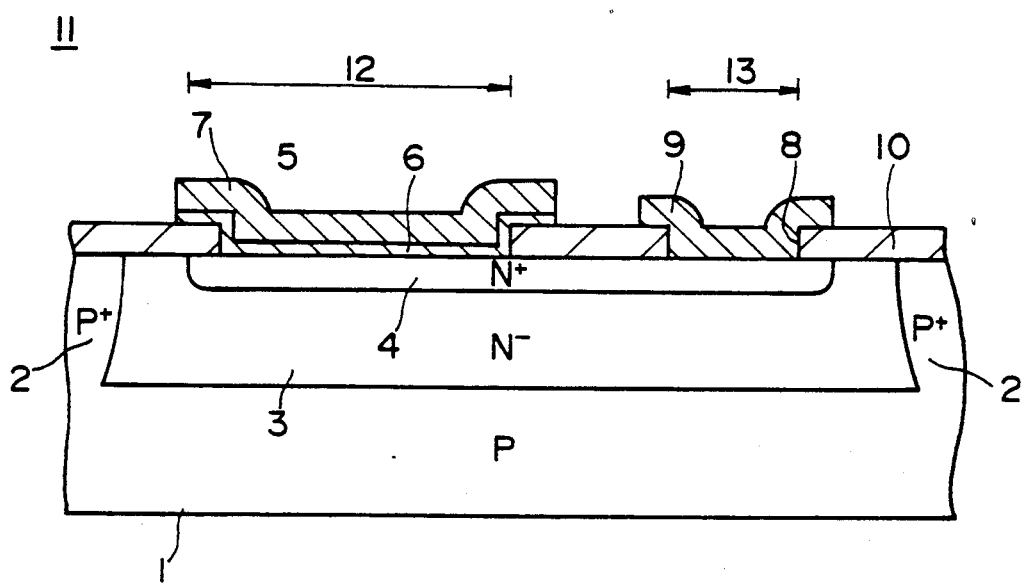
FIG. 7 is a sectional view of a conventional MIS capacitive element.

Furthermore, since the N+ buried layer 82 which connects the N+ plug-in region 46 of the MIS segment 91 to the N+ plug-in region 48 of the electrode lead segment 92 is formed merely in the juncture between 46a and 48a of the two plug-in regions 46 and 48, the parasitic capacitance (known as the junction capacitance) between the P-type semiconductor substrate 81 and the buried layer 82 will be reduced without increasing the parasitic resistance. More specifically, FIG. 5A graphically shows variations caused in the parasitic capacitance (curve I) and the parasitic resistance (curve II) when the size of the N+ buried layer 82 is changed. The size (b/a) of the N+ buried layer 82 is represented by the ratio of the length a of the N+ plug-in region 46 of the MIS segment 12 shown in FIG. 5B and the length b of contact of the N+ plug-in region 46 with the N+ buried layer 82. The graph of FIG. 5A shows that the parasitic capacitance becomes greater in proportion to a dimensional increase of the N+ buried layer 82, but if the buried layer 82 is formed merely in the juncture between the N+ plug-in region 46 and 48, the parasitic resistance can be reduced substantially relative to a value obtained when the buried layer 82 is formed over the entire N+ plug-in region 46. This shows that, due to formation of the N+ buried layer 82 merely between the adjacent edges of 46 and 48 the parasitic capacitance can be reduced without increasing the parasitic resistance. Thus, it becomes possible to realize a high-precision MIS capacitive element.

Figure 3:
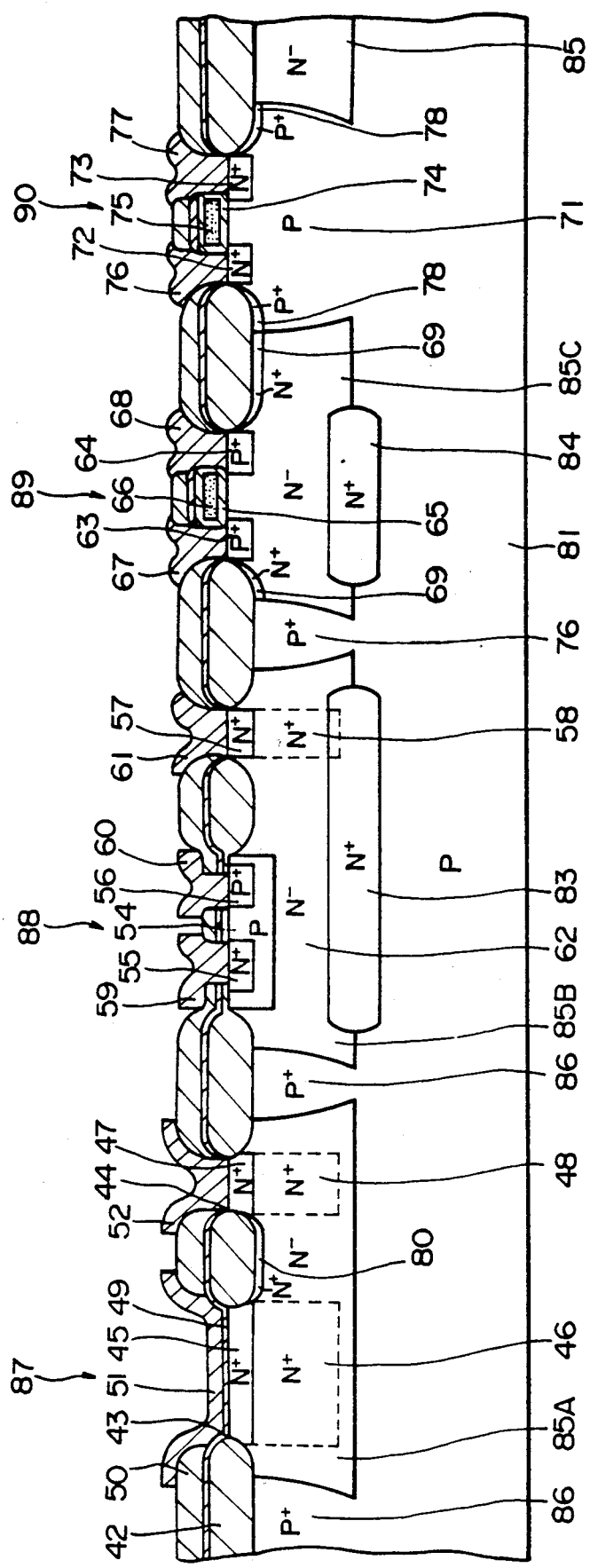
FIG. 3 is a sectional view of a second embodiment of the semiconductor device according to the present invention.
Figure 4:
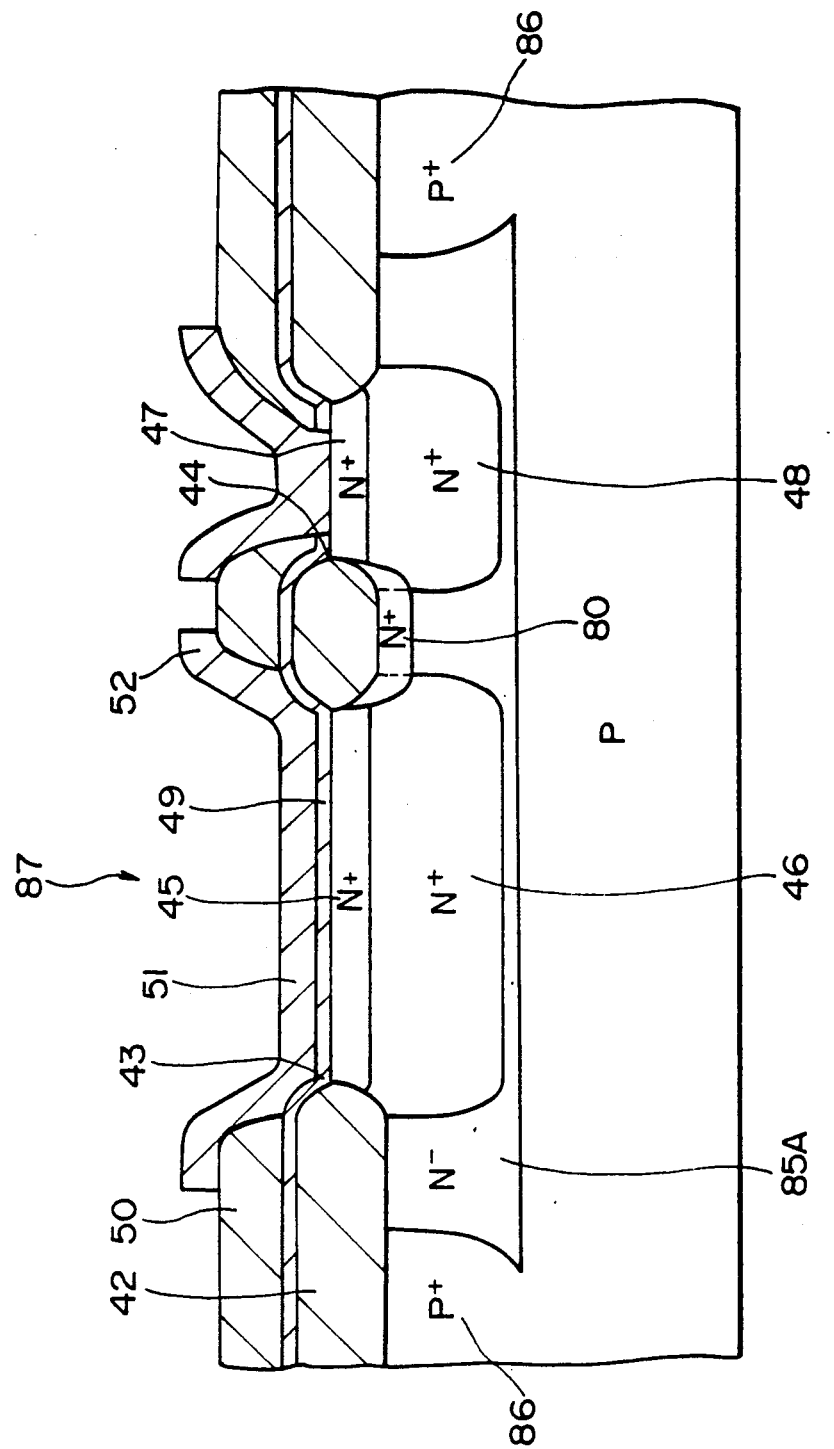
FIG. 4 is an enlarged sectional view of an MIS capacitive element of the embodiment of FIG. 3.

FIGS. 3 and 4 show a second exemplary embodiment of the present invention applied to a bipolar-CMOS element. In these figures, the components corresponding to those used in FIGS. 1 and 2 are denoted by the same reference numerals, and the explanation relative to those structures will not be repeated.

In the second embodiment, particularly relative to the previously mentioned high-concentration impurity region which connects the plug-in region 46 of the MIS segment 91 in the MIS capacitive element 87 to the N+ plug-in region 48 of the electrode lead segment 92, the N+ buried layer 82 shown in FIG. 2 is replaced with an N+ region 80 which is formed immediately below the field insulator film 42 between the N+ diffused region 49 and the N+ electrode lead region 47 simultaneously with a channel stop region in the CMOS transistor. The N+ region 80 is formed simultaneously with the N+ channel stop region 69 in the P-channel MOS transistor element 89. Otherwise the structure is the same as the embodiment shown in FIGS. 1 and 2.

In the MIS capacitive element of such a structure, the parasitic capacitance between the element and the P-type semiconductor substrate 31 can be reduced without causing an increase of the parasitic resistance in the same manner as in the example of FIGS. 1 and 2 so as to attain high precision in the MIS capacitive element.

According to the present invention, as described, an MIS capacitive element is formed by forming one electrode through a dielectric layer on an impurity region over to an aperture in a field insulator film. The area of such aperture in the field insulator film formed by selective oxidation can be obtained with high precision, so that it is possible to attain precise values of capacitance. Due to the fact that the high-concentration impurity region which connects the impurity region of the MIS segment to the electrode lead region of the electrode lead segment is formed merely in the junction between the impurity region and the electrode lead region, a reduction of the parasitic capacitance between the element and the substrate is obtained without causing an increase of the parasitic resistance so as to consequently produce an improved MIS capacitive element which has enhanced precision.

Although the invention has been described with respect to preferred embodiments, it is not to be so limited as changes and modifications can be made which are within the full intended scope of the invention as defined by the appended claims.

I claim as my invention:

1. A MIS capacitor comprising:
   a semiconductor substrate of a first conductivity type;
   a low-concentration impurity region of opposite conductivity type formed in said substrate;
   first and second high-concentration impurity regions of opposite conductivity type formed in said low-concentration impurity region, wherein said first and second high-concentration impurity region are laterally spaced from each other;
   a third high-concentration impurity regions of opposite conductivity type, which extends between the closes adjacent edges of said first and second high-concentration regions and is buried in the bottom of said low-concentration impurity region;
   a field insulator film having first and second apertures over said first and second high-concentration impurity regions respectively;
   a dielectric layer formed in said first aperture;
   a first electrode formed on said dielectric layer over said first aperture; and
   a second electrode formed on said second high-concentration impurity region over said second aperture.

2. A semiconductor device according to claim 1 including a field insulator film formed on said substrate, first and second apertures in said field insulator film for said first and second leads.

3. A semiconductor device according to claim 2, including a dielectric layer formed over said field insulator film and over said first aperture.

4. A MIS capacitor according to claim 1, wherein the depth of said first and second high-concentration impurity regions does not reach said substrate.

5. A MIS capacitor according to claim 1, wherein said low concentration impurity region is the epitaxial layer of opposite conductivity type.

6. A MIS capacitor comprising:
a substrate of a first conductivity type:
a low-concentration impurity region of opposite conductivity type formed in said substrate;
first and second high-concentration impurity regions of opposite conductivity type formed in said low-concentration impurity region, wherein said first and second high-concentration impurity region are laterally spaced from each other;
a third high-concentration impurity regions of opposite conductivity type adjacent the surface of said low-concentration impurity region, which extends between the closest adjacent edges of said first and second high-concentration regions;
a field insulator film having first and second apertures over said first and second high-concentration impurity regions respectively;
a dielectric layer formed in said first aperture;
a first electrode formed on said dielectric layer over said first aperture; and
a second electrode formed on said second high-concentration impurity region over said second aperture.

7. A semiconductor device according to claim 6 including a dielectric layer formed over said field insulator film and over said first aperture.

8. A MIS capacitor according to claim 6, wherein the depth of said first and second high-concentration impurity regions does not reach said substrate.

9. A MIS capacitor according to claim 6, wherein said low concentration impurity region is the epitaxial layer of opposite conductivity type.

10. A MIS capacitor according to claim 6, wherein said low concentration impurity region is the well region formed in said substrate.

* * * * *